(12) United States Patent
Floyd

(10) Patent No.: US 6,930,546 B2
(45) Date of Patent: Aug. 16, 2005

(54) BYPASS SWITCH TOPOLOGY FOR LOW-NOISE AMPLIFIERS

(75) Inventor: Brian Allan Floyd, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 33 days.

(21) Appl. No.: 10/671,984

(22) Filed: Sep. 26, 2003

(65) Prior Publication Data

US 2005/0068099 A1 Mar. 31, 2005

(51) Int. Cl.$^7$ ................................................ H03F 1/14
(52) U.S. Cl. .......................................... 330/51; 330/151
(58) Field of Search ............................ 330/51, 86, 110, 330/151, 302

(56) References Cited

U.S. PATENT DOCUMENTS

| | | | | |
|---|---|---|---|---|
| 5,399,927 | A | * | 3/1995 | Gruber et al. .............. 327/379 |
| 6,118,338 | A | | 9/2000 | Frank et al. |
| 6,144,254 | A | | 11/2000 | Irvine et al. |
| 6,172,566 | B1 | | 1/2001 | Nguyen |
| 6,175,274 | B1 | * | 1/2001 | Groe ........................ 330/51 |
| 6,211,729 | B1 | | 4/2001 | Morkner et al. |
| 6,351,183 | B1 | * | 2/2002 | Khabbaz et al. ............ 330/51 |
| 6,522,195 | B2 | * | 2/2003 | Watanabe et al. ........... 330/51 |
| 6,680,647 | B2 | * | 1/2004 | Brown et al. ............... 330/51 |
| 2002/0053947 | A1 | | 5/2002 | Macedo |
| 2003/0058041 | A1 | | 3/2003 | Koizumi |
| 2003/0112065 | A1 | | 6/2003 | Brown et al. |

OTHER PUBLICATIONS

S. Reynolds et al., "A Direct–Conversion Receiver IC for WCDMA Mobile Systems," IEEE, pp. 61–64, 2002.
H. Morkner et al., "A 1.7mA Low Noise Amplifier with Integrated Bypass Switch for Wireless 0.05–6GHz Portable Applications," XP–001067282, IEEE MTT–S Digest, pp. 293–296, 2001.
T. Nakatani et al., "A Wide Dynamic Range Switched–LNA in Sige BICMOS," XP–001067279, IEEE MTT–S Digest, pp. 281–284, 2001.

* cited by examiner

Primary Examiner—Henry Choe
(74) Attorney, Agent, or Firm—Ryan, Mason & Lewis, LLP

(57) ABSTRACT

A bypass switch topology for a low-noise amplifier is provided. In one aspect of the invention, an amplifier includes at least one signal amplifying transistor, coupled between an input terminal and an output terminal associated with the amplifier, for amplifying a received input signal. The amplifier also includes a bypass switch, coupled to the at least one signal amplifying transistor, for providing a gain (e.g., high-gain) mode operation and a bypass mode operation, the bypass switch including two transistors. In the gain mode operation, the two transistors of the bypass switch are off and the at least one signal amplifying transistor amplifies the received input signal and passes the amplified signal to the output terminal. In the bypass mode operation, the two transistors of the bypass switch are on, the at least one signal amplifying transistor is turned off, and the received input signal is passed directly from the input terminal to the output terminal.

15 Claims, 5 Drawing Sheets

$S_{21}$ OF BYPASSABLE LNA IN HIGH GAIN AND BYPASS MODES $S_{11}$ OF BYPASSABLE LNA IN HIGH GAIN AND BYPASS MODES $S_{22}$ OF BYPASSABLE LNA IN HIGH GAIN AND BYPASS MODES

US 6,930,546 B2

BYPASS SWITCH TOPOLOGY FOR LOW-NOISE AMPLIFIERS

FIELD OF THE INVENTION

The present invention relates to communications systems and, more particularly, to low noise amplifiers associated with communications transceivers.

BACKGROUND OF THE INVENTION

Being the first active circuit after the antenna in a radio transceiver, the low-noise amplifier (LNA) is a critical building block for a radio transceiver. To increase receiver sensitivity and reduce the amount of noise contributed by subsequent stages, the LNA is required to have a moderate gain and a low-noise figure. Typically, the LNA is preceded by a switch, duplexer, or filter and is very often followed by a filter. As a result, the LNA is required to be matched to the characteristic impedance of the system (usually 50 ohms) at its input and output.

When the input signal to the receiver is small, it is desired that the LNA provide maximum gain and minimum noise figure to increase receiver sensitivity. However, when the input signal to the receiver is large, the system can tolerate less gain and higher noise; thus, it is desired that the signal be routed around the LNA. Such an LNA is referred to as a switched-gain or bypassable LNA.

There are multiple examples of switched-gain LNAs known in the communications art. For example, U.S. Pat. Nos. 6,172,566, 6,175,274, 6,144,254, 6,522,195, 6,118,338 and 6,211,729, U.S. patent application publication No. US2002/0053947, and S. Reynolds et al., "A direct-conversion receiver IC for WCDMA mobile systems," Proc. 2002 Bipolar/BiCMOS Circuits and Technology Meeting, pp. 61–64, September 2002, the disclosures of which are incorporated by reference, describe various LNA architectures.

SUMMARY OF THE INVENTION

Principles of the present invention provide a bypass switch topology for a low-noise amplifier.

In a first aspect of the invention, an amplifier includes at least one signal amplifying transistor, coupled between an input terminal and an output terminal associated with the amplifier, for amplifying a received input signal. The amplifier also includes a bypass switch, coupled to the at least one signal amplifying transistor, for providing a gain (e.g., high-gain) mode operation and a bypass mode operation, the bypass switch including two transistors. In the gain mode operation, the two transistors of the bypass switch are off and the at least one signal amplifying transistor amplifies the received input signal and passes the amplified signal to the output terminal. In the bypass mode operation, the two transistors of the bypass switch are on, the at least one signal amplifying transistor is turned off, and the received input signal is passed directly from the input terminal to the output terminal.

The amplifier may further include a controller, coupled to the at least one signal amplifying transistor, for controlling selection of gain mode and bypass mode operations. The controller may be turned off during the bypass mode operation. The amplifier may also include an inductor coupled between an emitter terminal of the at least one signal amplifying transistor and ground. The amplifier may also include an output impedance matching network coupled to the at least one signal amplifying transistor and the output terminal. The amplifier may also include an input impedance matching network coupled to the at least one signal amplifying transistor and the input terminal.

Further, supply power to the bypass switch may be turned off during the bypass mode operation. Still further, respective gate terminals of the two transistors of the bypass switch may be coupled to each another, a source terminal of one of the two transistors may be coupled to a drain terminal of the other of the two transistors and to the output terminal of the amplifier, a drain terminal of one of the two transistors may be coupled to the input terminal of the amplifier, and a source terminal of the other of the two transistors may be coupled to a collector terminal of the at least one signal amplifying transistor. The amplifier may be implemented in BiCMOS or CMOS technology.

In a second aspect of the invention, the signal amplifying transistor may be replaced with a cascode transistor pair.

In a third aspect of the invention, an amplifier includes at least one signal amplifying transistor, coupled between an input terminal and an output terminal associated with the amplifier, for amplifying a received input signal. The amplifier also includes a bypass switch, coupled to the at least one signal amplifying transistor, for providing a gain mode operation and a bypass mode operation. The amplifier also includes an output impedance matching network, coupled to the at least one signal amplifying transistor and the output terminal. In the gain mode operation, the bypass switch is inactive and the at least one signal amplifying transistor amplifies the received input signal and passes the amplified signal to the output terminal. In the bypass mode operation, the bypass switch is active, the at least one signal amplifying transistor is turned off, the received input signal is passed directly from the input terminal to the output terminal, and a load impedance is not modified by the output impedance matching network.

In a fourth aspect of the invention, such an amplifier, as described herein, is part of a communications receiver. At least a portion of the communications receiver may be implemented as an integrated circuit.

In a fifth aspect of the invention, a method of providing a gain mode operation and a bypass mode operation in a low-noise amplifier includes the following steps. The low-noise amplifier is configured to include: (i) at least one signal amplifying transistor, coupled between an input terminal and an output terminal associated with the amplifier, for amplifying a received input signal; and (ii) a bypass switch, coupled to the at least one signal amplifying transistor, for providing a gain mode operation and a bypass mode operation, the bypass switch including two transistors. In the gain mode operation, the two transistors of the bypass switch are off and the at least one signal amplifying transistor amplifies the received input signal and passes the amplified signal to the output terminal. In the bypass mode operation, the two transistors of the bypass switch are on, the at least one signal amplifying transistor is turned off, and the received input signal is passed directly from the input terminal to the output terminal.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

The following description will illustrate the invention using an exemplary Wideband Code Division Multiple Access (W-CDMA) communications system environment. It should be understood, however, that the invention is not limited to use in any particular communications system environment. The invention is instead more generally applicable to any communications system environment in which it is desirable to provide low-noise amplifier with a bypass switch topology.

Figure 1:
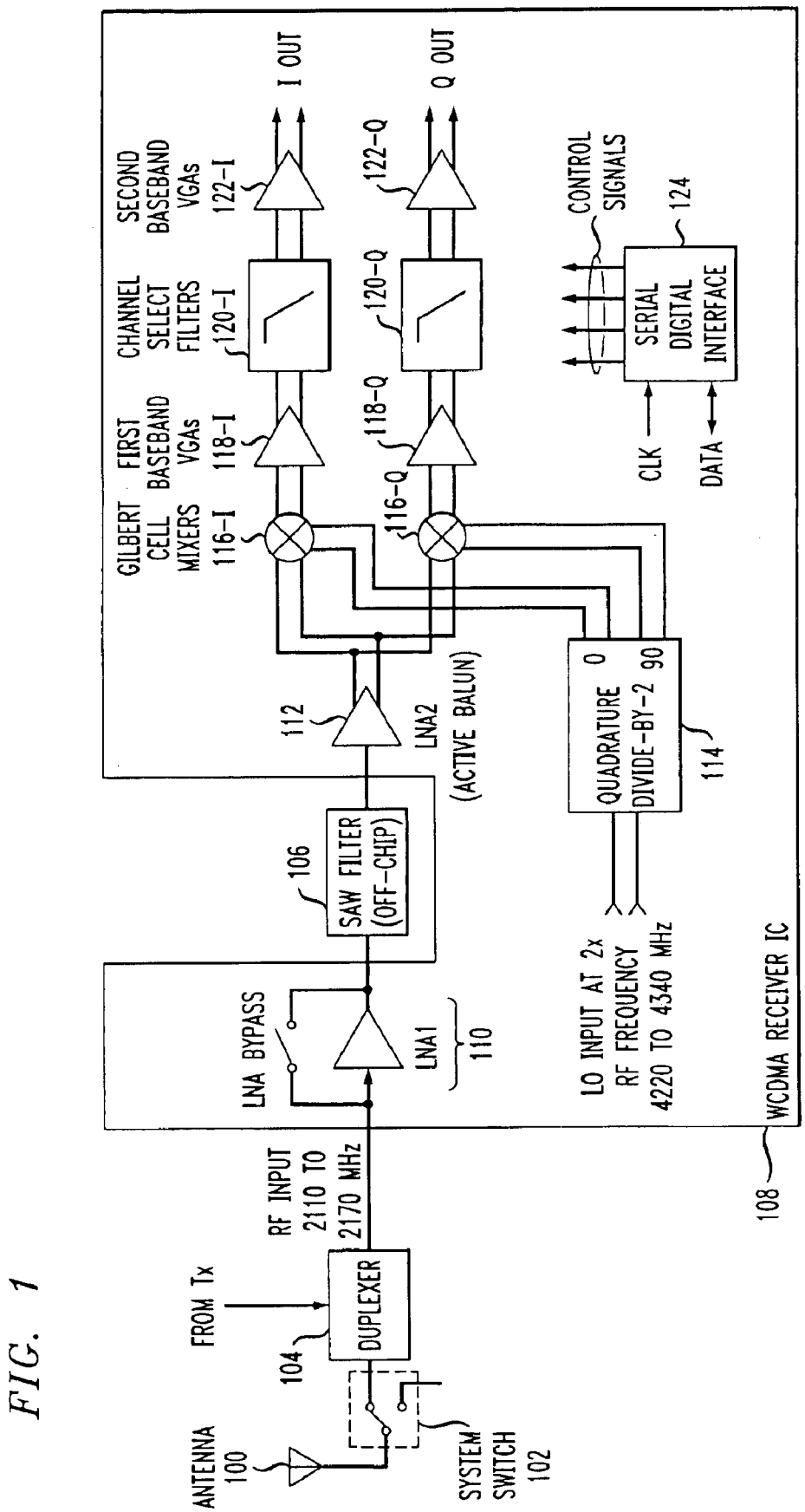
FIG. 1 is a block diagram illustrating a W-CDMA receiver in which a low-noise amplifier with a bypass switch topology according to an embodiment of the invention may be employed.

FIG. 1 illustrates a block diagram of a Wideband Code Division Multiple Access (W-CDMA) receiver in which a low-noise amplifier with a bypass switch topology according to an embodiment of the invention may be employed.

As shown, the W-CDMA receiver architecture in FIG. 1 includes an antenna 100, a system switch 102, a duplexer 104, a surface acoustic wave (SAW) filter 106 and a receiver integrated circuit (IC) 108. The receiver IC 108 includes a bypassable low-noise amplifier (LNA1) 110, a low-noise amplifier (LNA2) 112, a quadrature divide-by-2 module 114, mixers 116-I (in phase) and 116-Q (quadrature phase), basesband variable gain amplifiers (VGAs) 118-I and 118-Q, channel select filters 120-I and 120-Q, basesband VGAs 122-I and 122-Q, and a serial digital interface 124. Since the focus of the invention is on a switched-gain or bypassable low-noise amplifier (e.g., LNA1) and since the other components in the receiver architecture shown in FIG. 1 are well known in the communications art, a detailed description of these other components will not be provided herein.

While other switched-gain LNAs have been proposed (e.g., see the background section above), one major disadvantage of most of these existing designs is that the LNA circuit consumes power in the bypass mode. For those existing LNA designs that do not consume power in the bypass mode, typically one or more circuit elements (e.g., inductor) must be added to ensure impedance matching in the bypass mode. However, the addition of such elements increases the circuit size considerably, and may also increase the impedance tuning complexity of the circuit.

Thus, a key problem that the invention solves is the implementation of a bypassable LNA which is matched input and output to 50 ohms in both the high-gain mode and bypass mode, and which consumes no current in the bypass mode. Having such an LNA allows the overall receiver power consumption to be optimized against the received signal strength, resulting in reduced total power consumption. This, in turn, leads to increased battery life for handsets using this type of LNA.

Figure 2:
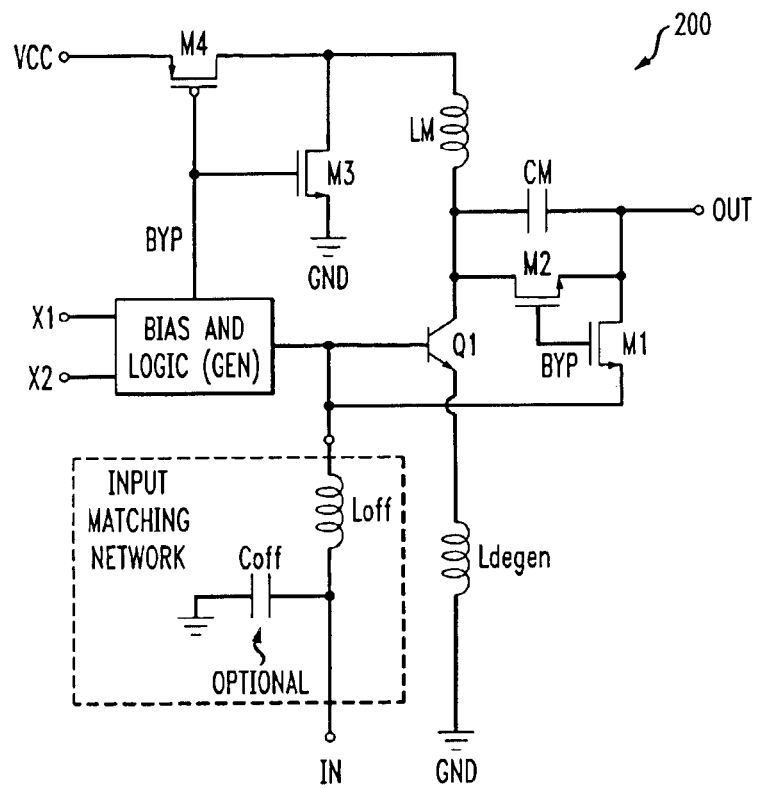
FIG. 2 is a schematic diagram illustrating a BiCMOS low-noise amplifier with a bypass switch topology according to an embodiment of the invention.

A schematic diagram illustrating a bipolar complementary metal oxide semiconductor (BiCMOS) low-noise amplifier with a bypass switch topology according to an embodiment of the invention is shown in FIG. 2.

The functional core of LNA 200 includes a common emitter bipolar transistor (Q1) with inductive degeneration (Ldegen), an on-chip output matching network including LM and CM, and an on-chip bias generator GEN including digital control circuitry to control the gain or bypass mode of the circuit. Such a bias and logic module may be generally referred to as a controller. One of ordinary skill in the art will realize various implementations of such a controller given the functional descriptions provided herein. The input matching network to the LNA can be implemented either on or off chip, and includes at least of a series inductor (Loff) and potentially an additional shunt capacitor (Coff).

Bypassing of the LNA is realized with switches M1 and M2, where switch M2 bypasses the series capacitor in the output matching network, while switch M1 bypasses the entire amplifier. Additionally, so that the bypass switches do not dissipate power or add noise, the supply (Vcc) is turned off in the bypass mode (this function could also be realized by placing a large direct current blocking capacitor in series with M2). This multiplexing function is realized through transistors M3 and M4.

It is to be appreciated that bipolar transistor Q1 includes collector, base and emitter terminals (depicted in the figures using typical circuit drawing convention) that are respectively connected to other elements in the LNA circuit as shown. M1 through M4 (and MT and MB in FIG. 3 to be described below) are field effect transistors including respective source, gate and drain terminals (depicted in the figures using typical circuit drawing convention) that are respectively connected to other elements in the LNA circuit as shown.

Figure 3:
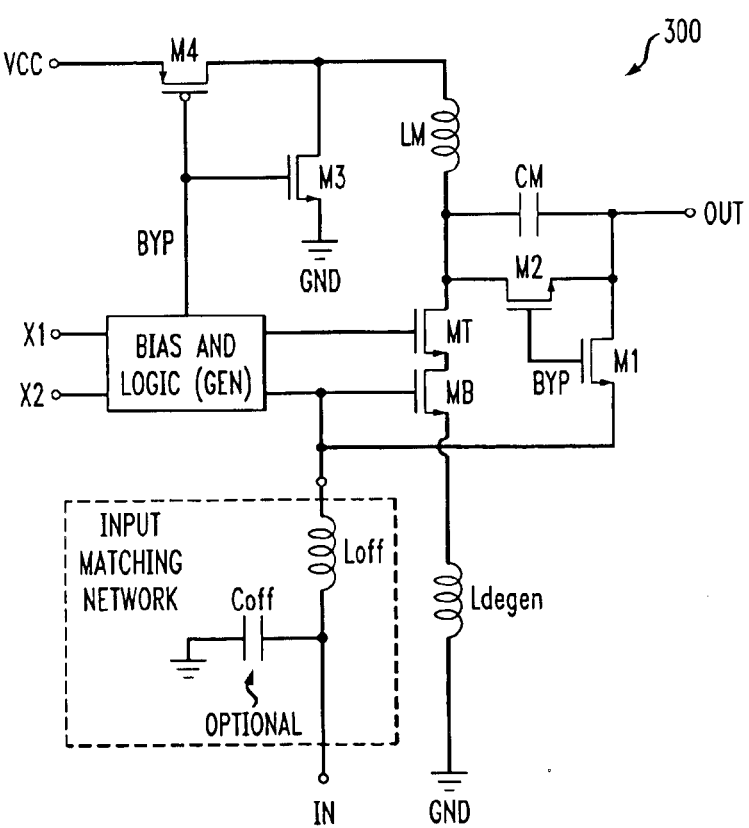
FIG. 3 is a schematic diagram illustrating a CMOS low-noise amplifier with a bypass switch topology according to an embodiment of the invention.

Note that the novel bypass switch topology can be utilized with either BiCMOS or CMOS technologies. A representative schematic of a CMOS version is shown in FIG. 3, where a cascode including transistors MB and MT is used in place of the common-emitter Q1. In both representations of the circuit, inputs X1 and X2 select the state of the LNA to be in either one of three gain modes (for this particular example) or in the bypass mode.

A key to the inventive design is utilizing a two-transistor bypass switch. In high-gain mode, BYP=0, transistors M1 and M2 are off, and the LNA signal is amplified by Q1. In bypass mode, BYP=1, transistors M1 and M2 are on, transistor Q1 is turned off (its base is pulled to ground, and the bias generator GEN is turned off), and the signal is routed directly from the input to the output. Since Q1 and the bias generator circuits are turned off, the LNA consumes no power in bypass mode.

While the inventive topology is particularly suitable for use in LNAs with integrated output matching networks, the topology can be applied to LNAs with off-chip matching networks by using an extra pad in the design (i.e., LM and CM are off-chip, while M1 and M2 are on chip; thus, both the drain and source nodes of M2 have to be connected to pads).

The advantage of the two-transistor switch topology is that the constraints placed by the bypass condition on the allowable input and output matching networks are lessened considerably, thereby allowing the circuit to easily meet matching criteria in both high-gain and bypass modes, as well as meeting gain, noise, and linearity criteria.

Ideally, the amplifier design should be optimized only for the high-gain mode, with the bypass mode not constraining the design at all. The topology presented in FIG. 2 effectively realizes this, decoupling the bypass and high-gain modes.

Figure 4:
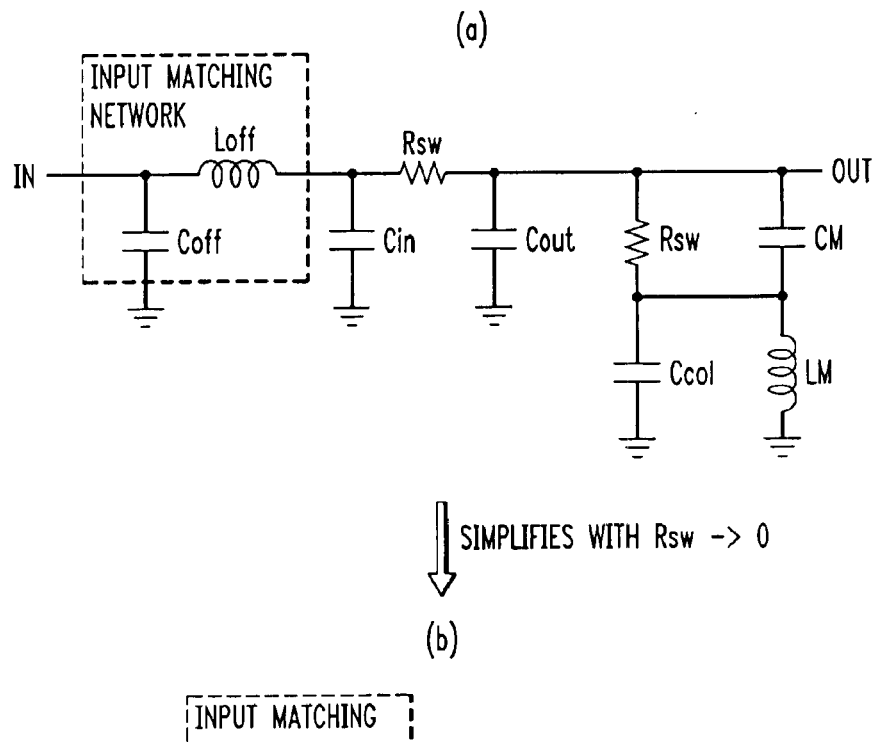
FIGS. 4A and 4B are schematic diagrams illustrating small-signal equivalent circuits of the low-noise amplifier of FIG. 2 in bypass mode.

A small-signal equivalent circuit of the novel bypass network is shown in FIG. 4A. In this schematic, Rsw is the MOS switch resistance, while Cin, Cout, and Ccol are the total parasitic capacitances at the input base, output, and collector nodes, respectively. This network can be simplified to that shown in FIG. 4B by assuming that the switch impedance is low (i.e., Rsw->0); thus, CM is shorted out, while all of the on-chip parasitic capacitance can be lumped together into Ctot, which is now in parallel with LM. The entire on-chip portion of the LNA then behaves as a single parallel resonant circuit. Realizing the 50-ohm match therefore involves the tuning of this parallel resonant circuit together with the input matching network. The tuning of the parallel resonant circuit is realized by scaling the sizes of the bypass transistors.

Figure 5:
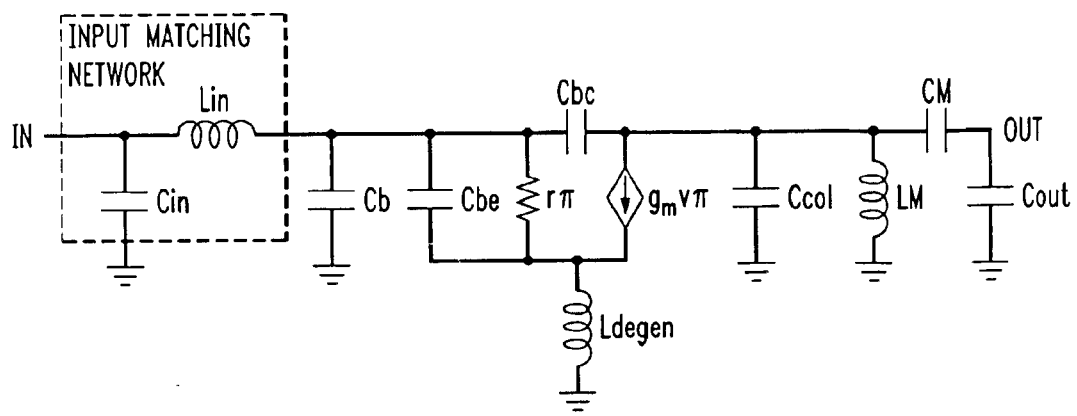
FIG. 5 is a schematic diagram illustrating a small-signal equivalent circuit of the low-noise amplifier of FIG. 2 in high-gain mode.

A small-signal equivalent circuit of the LNA when operated in a high-gain mode is shown in FIG. 5, in order to demonstrate the decoupling of the high-gain and bypass modes from a matching perspective.

The input matching network may be designed by selecting Ldegen such that the real part of the input impedance looking into the base of the transistor is in the range of 30 to 50 ohms (gm/Cbe*Ldegen). Then, the input match is completed by selecting Lin and Cin to transform the impedance looking into the base (the real part arising from Ldegen, the imaginary part arising Cbc and Ldegen, and both the real and imaginary contributions from the Miller effect on Cbc).

The output matching network may be designed by selecting a suitably high LM such that the LNA provides enough gain, and then choosing CM to bring the output match to close to 50 ohms. For both the input and output match, the only contributions from the bypass switches is from their parasitics (lumped into Cb, Cout, and Ccol). Thus, the designer is free to choose the input and output match independent of bypass considerations.

Figure 6:
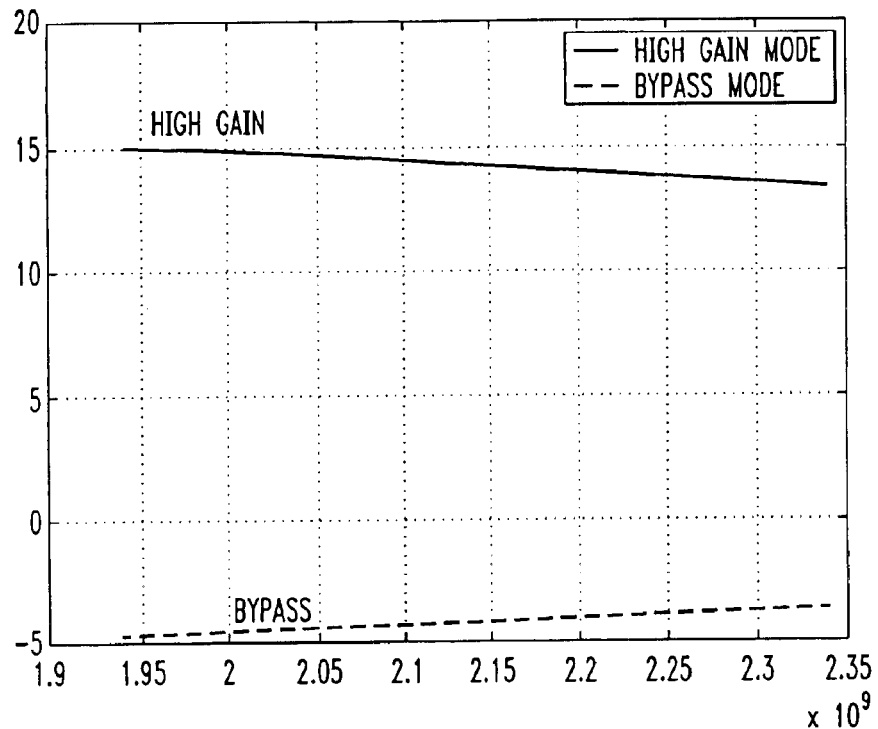
FIG. 6 is a graph illustrating a simulated gain (S21) of a low-noise amplifier in high-gain and bypass modes according to an embodiment of the invention.
Figure 7:
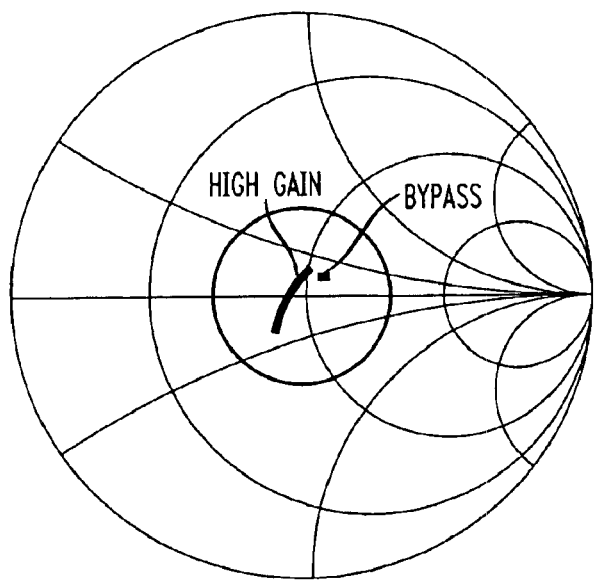
FIG. 7 is a chart illustrating a simulated input reflection coefficient (S11) of a low-noise amplifier in high-gain and bypass modes according to an embodiment of the invention.
Figure 8:
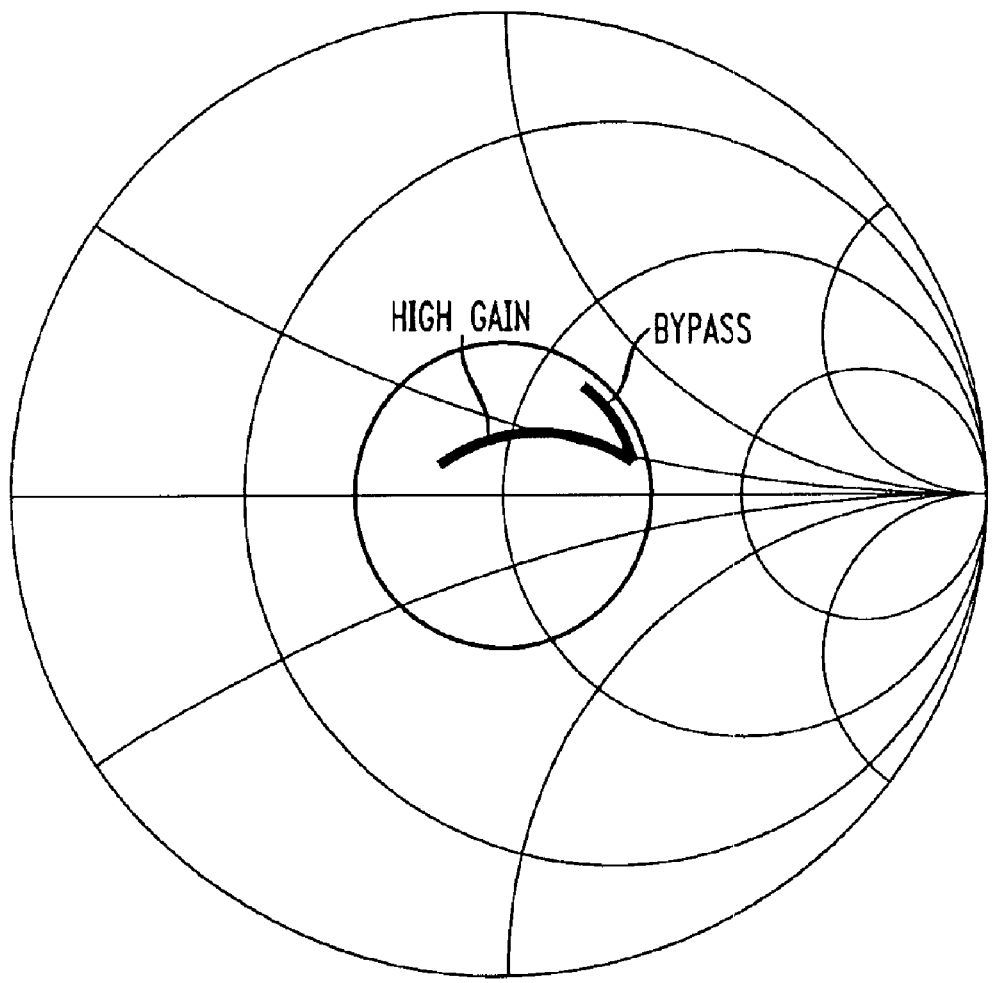
FIG. 8 is a chart illustrating a simulated output reflection coefficient (S22) of a low-noise amplifier in high-gain and bypass modes according to an embodiment of the invention.

The simulated performance of the bypassable LNA with the novel bypass switch topology is shown in FIG. 6, FIG. 7, and FIG. 8. This LNA is optimized for operation in the 2110–2170 Megahertz (MHz) frequency band, though the bypass switch topology presented here is not frequency-band specific.

FIG. 6 shows the simulated gain, or S21, of the LNA in the high-gain and bypass modes. In high gain, the LNA exhibits 14 dB of gain; while in bypass mode, the LNA exhibits 4 dB of loss. Once again, the LNA consumes no current in the bypass mode.

FIG. 7 shows the simulated S11 on a Smith chart for the bypassable LNA. For reference, a circle corresponding to a VSWR=1.9:1 (equivalent to S11=–10 dB) is also shown. All points inside this circle would have a VSWR<1.9:1 (or S11<–10 dB), which is the typical input and output matching requirement for the LNA. From this plot, it can be seen that the LNA is well-matched to 50 ohms. The simulated S11 is –25 dB in the high-gain mode and –19 dB in the bypass mode.

FIG. 8 shows the simulated S22 on a Smith chart for the bypassable LNA. Once again, a VSWR=1.9:1 circle is included for reference. The simulated S22 is –15 dB in the high-gain mode and –11 dB in the bypass mode. These three figures demonstrate the correct operation of the bypassable LNA.

Advantageously, as is evident from the principles of the invention described herein, an LNA circuit of the invention does not consume power in the bypass mode. Further, an LNA circuit of the invention implements a single-stage topology, thus avoiding reduced linearity attributable to multi-stage topologies. Also, the novel bypass switch topology of the invention differs from existing LNA architectures in that, from an impedance standpoint, the 50-ohm load impedance is not modified by the output matching network in the bypass mode. Rather, the entire on-chip LNA may behave as a single parallel resonant circuit in parallel with the 50-ohm load.

Still further, the inventive solution is much simpler to implement as compared to existing design approaches, thereby reducing the overall time required in the design process. Also, the decoupling of the bypass and high-gain modes from a matching perspective means that for some situations, it now becomes possible to realize a given gain for a given matching requirement in both high-gain and bypass modes.

It is to be appreciated that while specific circuit embodiments of the methodologies of the invention have been provided and explained above, at least a portion of such inventive amplifier design approaches may be implemented, for example, by one or more digital signal processors with associated memory, application specific integrated circuit(s), one or more appropriately programmed general purpose digital computers with associated memory. One of ordinary skill in the art will contemplate various other ways of implementing the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An amplifier, comprising:
    at least one signal amplifying transistor, coupled between an input terminal and an output terminal associated with the amplifier, for amplifying a received input signal; and
    a bypass switch, coupled to the at least one signal amplifying transistor, for providing a gain mode operation and a bypass mode operation, the bypass switch comprising two transistors;
    wherein in the gain mode operation, the two transistors of the bypass switch are off and the at least one signal amplifying transistor amplifies the received input signal and passes the amplified signal to the output terminal;
    further wherein in the bypass mode operation, the two transistors of the bypass switch are on, a series output matching element is shorted, the at least one signal amplifying transistor is turned off, and the received input signal is passed directly from the input terminal to the output terminal.

2. The amplifier of claim 1, further comprising a controller, coupled to the at least one signal amplifying transistor, for controlling selection of gain mode and bypass mode operations.

3. The amplifier of claim 2, wherein the controller is turned off during the bypass mode operation.

4. The amplifier of claim 1, further comprising an inductor coupled between an emitter terminal of the at least one signal amplifying transistor and ground.

5. The amplifier of claim 1, further comprising an output impedance matching network coupled to the at least one signal amplifying transistor and the output terminal.

6. The amplifier of claim 1, further comprising an input impedance matching network coupled to the at least one signal amplifying transistor and the input terminal.

7. The amplifier of claim 1, wherein supply power to the bypass switch is turned off during the bypass mode operation.

8. An amplifier, comprising:
at least one signal amplifying transistor, coupled between an input terminal and an output terminal associated with the amplifier, for amplifying a received input signal; and
a bypass switch, coupled to the at least one signal amplifying transistor, for providing a gain mode operation and a bypass mode operation, the bypass switch comprising two transistors;
wherein in the gain mode operation, the two transistors of the bypass switch are off and the at least one signal amplifying transistor amplifies the received input signal and passes the amplified signal to the output terminal;
wherein in the bypass mode operation, the two transistors of the bypass switch are on, the at least one signal amplifying transistor is turned off, and the received input signal is passed directly from the input terminal to the output terminal;
wherein respective gate terminals of the two transistors of the bypass switch are coupled to each another, wherein a source terminal of one of the two transistors is coupled to a drain terminal of the other of the two transistors and to the output terminal of the amplifier, wherein a drain terminal of one of the two transistors is coupled to the input terminal of the amplifier, and wherein a source terminal of the other of the two transistors is coupled to a collector terminal of the at least one signal amplifying transistor.

9. The amplifier of claim 1, wherein the amplifier is implemented in BiCMOS and technology.

10. The amplifier of claim 1, wherein the amplifier is implemented in CMOS technology.

11. An amplifier, comprising:
a cascode transistor pair, coupled between an input terminal and an output terminal associated with the amplifier, for amplifying a received input signal; and
a bypass switch, coupled to the cascode transistor pair, for providing a gain mode operation and a bypass mode operation, the bypass switch comprising two transistors;
wherein in the gain mode operation, the two transistors of the bypass switch are off and the cascode transistor pair amplifies the received input signal and passes the amplified signal to the output terminal;
further wherein in the bypass mode operation, the two transistors of the bypass switch are on, a series output matching element is shorted, the cascode transistor pair is turned off, and the received input signal is passed directly from the input terminal to the output terminal.

12. An amplifier, comprising:
at least one signal amplifying transistor, coupled between an input terminal and an output terminal associated with the amplifier, for amplifying a received input signal;
a bypass switch, coupled to the at least one signal amplifying transistor, for providing a gain mode operation and a bypass mode operation; and
an output impedance matching network, coupled to the at least one signal amplifying transistor and the output terminal; wherein in the gain mode operation, the bypass switch is inactive and the at least one signal amplifying transistor amplifies the received input signal and passes the amplified signal to the output terminal;
further wherein in the bypass mode operation, the bypass switch is active, the at least one signal amplifying transistor is turned off, the received input signal is passed directly from the input terminal to the output terminal, and a load impedance is not modified by the output impedance matching network.

13. A communications receiver, comprising:
a low-noise amplifier having an input terminal and an output terminal, the low-noise amplifier comprising:
at least one signal amplifying transistor, coupled between an input terminal and an output terminal associated with the low-noise amplifier, for amplifying a received input signal; and
the at least one signal amplifying transistor, for providing a gain mode operation and a bypass mode operation, the bypass switch comprising two transistors;
wherein in the gain mode operation, the two transistors of the bypass switch are off and the at least one signal amplifying transistor amplifies the received input signal and passes the amplified signal to the output terminal;
further wherein in the bypass mode operation, the two transistors of the bypass switch are on, a series output matching element is shorted, the at least one signal amplifying transistor is turned off, and the received input signal is passed directly from the input terminal to the output terminal.

14. The communications receiver of claim 13, wherein at least a portion of the receiver is implemented as an integrated circuit.

15. A method of providing a gain mode operation and a bypass mode operation in a low-noise amplifier, comprising the steps of:
configuring the low-noise amplifier to comprise: (i) at least one signal amplifying transistor, coupled between an input terminal and an output terminal associated with the amplifier, for amplifying a received input signal; and (ii) a bypass switch, coupled to the at least one signal amplifying transistor, for providing a gain mode operation and a bypass mode operation, the bypass switch comprising two transistors;
in the gain mode operation, turning off the two transistors of the bypass switch and amplifying the received input signal with the at least one signal amplifying transistor, and passing the amplified signal to the output terminal;
in the bypass mode operation, turning on the two transistors of the bypass switch, shorting a series output matching element, turning off the at least one signal amplifying transistor, and directly passing the received input signal from the input terminal to the output terminal.

* * * * *